(12) United States Patent
Drayton et al.

(10) Patent No.: US 8,173,482 B2
(45) Date of Patent: May 8, 2012

(54) DEVICES AND METHODS OF PROTECTING A CADMIUM SULFIDE FOR FURTHER PROCESSING

(75) Inventors: Jennifer Ann Drayton, Golden, CO (US); Richard Ernest Demaray, Portola Valley, CA (US)

(73) Assignee: PrimeStar Solar, Inc., Arvada, CO (US)

( * ) Notice: Subject to any disclaimer, the term of this patent is extended or adjusted under 35 U.S.C. 154(b) by 0 days.

(21) Appl. No.: 12/771,515

(22) Filed: Apr. 30, 2010

(65) Prior Publication Data

US 2011/0269261 A1  Nov. 3, 2011

(51) Int. Cl.
*H01L 31/18* (2006.01)
*H01L 49/02* (2006.01)

(52) U.S. Cl. ............... 438/95; 438/86; 257/E31.008

(58) Field of Classification Search ............ 438/86, 438/95

See application file for complete search history.

(56) References Cited

U.S. PATENT DOCUMENTS

| | | | |
|---|---|---|---|
| 5,261,968 A | 11/1993 | Jordan | |
| 5,393,675 A | 2/1995 | Compaan | |
| 5,922,142 A | 7/1999 | Wu et al. | |
| 6,137,048 A | 10/2000 | Wu et al. | |
| 6,169,246 B1 | 1/2001 | Wu et al. | |
| 6,221,495 B1 | 4/2001 | Wu et al. | |
| 6,913,943 B2 | 7/2005 | Cunningham et al. | |
| 2005/0009228 A1 | 1/2005 | Wu et al. | |
| 2008/0251119 A1 | 10/2008 | Forehand | |
| 2009/0194165 A1 | 8/2009 | Murphy et al. | |
| 2009/0242029 A1 | 10/2009 | Paulson et al. | |

OTHER PUBLICATIONS

Xiangxin Liu et al: "Migration and oxidation of sulfur at the back contact in CdTe cells", Photovoltaic Specialists Conference (PVSC), 2009 34th IEEE, IEEE, Piscataway, NJ, USA, Jun. 7, 2009, pp. 2107-2110,XP031626712.
EP Search Report issued in connection with corresponding EP Patent Application No. 11163295.6 filed on Apr. 20, 2011.

*Primary Examiner* — Alexander Ghyka
(74) *Attorney, Agent, or Firm* — Dority & Manning, P.A.

(57) ABSTRACT

Methods for protecting a cadmium sulfide layer on a substrate are provided. The method can include sputtering a cadmium sulfide layer onto a substrate from a cadmium sulfide target at a sputtering pressure (e.g., about 10 mTorr to about 150 mTorr), and sputtering a cap layer directly on the cadmium sulfide layer. The cap layer can be sputtered directly onto the cadmium sulfide layer without breaking vacuum of the sputtering pressure. Methods are also provided for manufacturing a cadmium telluride based thin film photovoltaic device through depositing a cadmium sulfide layer on a substrate, depositing a cap layer directly on the cadmium sulfide layer, heating the substrate to sublimate at least a portion of the cap layer from the cadmium sulfide layer, and then depositing a cadmium telluride layer on the cadmium sulfide layer. An intermediate substrate for forming a cadmium telluride based thin-film photovoltaic device is also provided.

19 Claims, 4 Drawing Sheets

DEVICES AND METHODS OF PROTECTING A CADMIUM SULFIDE FOR FURTHER PROCESSING

FIELD OF THE INVENTION

The subject matter disclosed herein relates generally to protecting a cadmium sulfide layer for further processing and protected cadmium sulfide layers. More particularly, the subject matter disclosed herein relates to methods of protecting a cadmium sulfide layer for use in the manufacture of cadmium telluride thin film photovoltaic devices.

BACKGROUND OF THE INVENTION

Thin film photovoltaic (PV) modules (also referred to as "solar panels") based on cadmium telluride (CdTe) paired with cadmium sulfide (CdS) as the photo-reactive components are gaining wide acceptance and interest in the industry. CdTe is a semiconductor material having characteristics particularly suited for conversion of solar energy to electricity. For example, CdTe has an energy bandgap of about 1.45 eV, which enables it to convert more energy from the solar spectrum as compared to lower bandgap semiconductor materials historically used in solar cell applications (e.g., about 1.1 eV for silicon). Also, CdTe converts radiation energy in lower or diffuse light conditions as compared to the lower bandgap materials and, thus, has a longer effective conversion time over the course of a day or in cloudy conditions as compared to other conventional materials. The junction of the n-type layer and the p-type layer is generally responsible for the generation of electric potential and electric current when the CdTe PV module is exposed to light energy, such as sunlight. Specifically, the cadmium telluride (CdTe) layer and the cadmium sulfide (CdS) form a p-n heterojunction, where the CdTe layer acts as a p-type layer (i.e., a positive, electron accepting layer) and the CdS layer acts as a n-type layer (i.e., a negative, electron donating layer).

During processing of cadmium telluride based PV devices, the window layers (e.g., the cadmium sulfide layer) are typically deposited prior to the cadmium telluride layer. However, the cadmium sulfide layer is susceptible to exposure to atmospheric contamination prior to deposition of subsequent layers (e.g., the cadmium telluride layer). However, exposing the cadmium sulfide layer to air can adversely affect the interface between the cadmium sulfide layer and subsequent layers (e.g., a cadmium telluride layer) by introducing contaminants to the cadmium sulfide layer. Additionally, during the deposition of a subsequent cadmium telluride layer on the cadmium sulfide layer via a hot deposition process (e.g., close space sublimations), cadmium sulfide can sublimate from the surface of the substrate due to cadmium sulfides lower sublimation temperature. Thus, the cadmium sulfide layer must be deposited to a greater thickness than desired in order to compensate for the loss of the layer during subsequent processing. Additionally, the sublimation of the cadmium sulfide layer can add compositional additions of cadmium and sulfur to the subsequent layer (e.g., a cadmium telluride layer). The heating process during deposition of subsequent layers can also alter the as-deposited morphology of the cadmium sulfide (e.g., amorphous or fine grain size).

Thus, a need exists for a method of protecting the cadmium sulfide layer during the manufacture of a cadmium telluride based PV device without adversely affecting the resulting PV device.

BRIEF DESCRIPTION OF THE INVENTION

Aspects and advantages of the invention will be set forth in part in the following description, or may be obvious from the description, or may be learned through practice of the invention.

Methods are generally provided for protecting a cadmium sulfide layer on a substrate. In one particular embodiment, the method can include sputtering a cadmium sulfide layer onto a substrate from a cadmium sulfide target at a sputtering pressure (e.g., about 10 mTorr to about 150 mTorr), and sputtering a cap layer directly on the cadmium sulfide layer. The cap layer can be sputtered directly onto the cadmium sulfide layer without breaking vacuum of the sputtering pressure.

Methods are also generally provided for manufacturing a cadmium telluride based thin film photovoltaic device. For example, one particular embodiment of the method can include depositing a cadmium sulfide layer on a substrate and depositing a cap layer directly on the cadmium sulfide layer. The cap layer can include cadmium telluride. The substrate can be heated to sublimate at least a portion of the cap layer from the cadmium sulfide layer. Then, a cadmium telluride layer can be deposited on the cadmium sulfide layer.

An intermediate substrate for forming a cadmium telluride based thin-film photovoltaic device is also generally provided. The intermediate substrate can include a substrate, a transparent conductive oxide layer on the substrate, a cadmium sulfide layer on the transparent conductive oxide layer, and a cap layer with a thickness of about 10 nm to about 150 nm directly on the cadmium sulfide layer.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWING

A full and enabling disclosure of the present invention, including the best mode thereof, directed to one of ordinary skill in the art, is set forth in the specification, which makes reference to the appended figures, in which.

Figure 1:
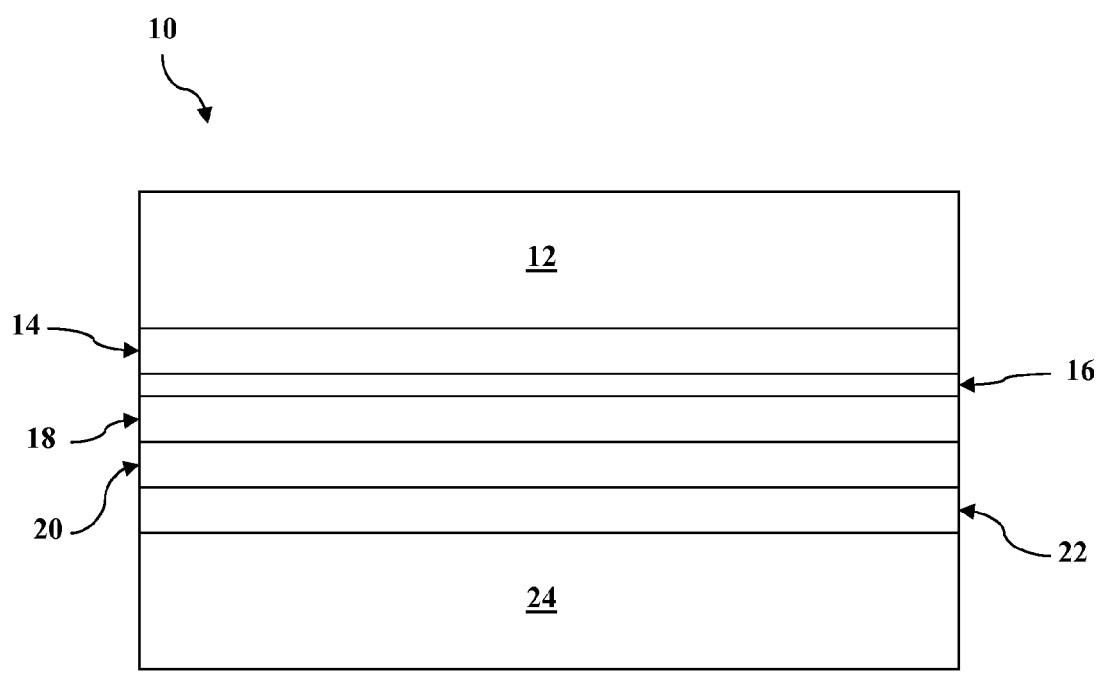
FIG. 1 shows a general schematic of a cross-sectional view of an exemplary cadmium telluride thin film photovoltaic device according to one embodiment of the present invention.

Repeat use of reference characters in the present specification and drawings is intended to represent the same or analogous features or elements.

DETAILED DESCRIPTION OF THE INVENTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

In the present disclosure, when a layer is being described as "on" or "over" another layer or substrate, it is to be understood that the layers can either be directly contacting each other or have another layer or feature between the layers. Thus, these terms are simply describing the relative position of the layers to each other and do not necessarily mean "on top of" since the relative position above or below depends upon the orientation of the device to the viewer. Additionally, although the invention is not limited to any particular film thickness, the term "thin" describing any film layers of the photovoltaic device generally refers to the film layer having a thickness less than about 10 micrometers ("microns" or "µm").

It is to be understood that the ranges and limits mentioned herein include all ranges located within the prescribed limits (i.e., subranges). For instance, a range from about 100 to about 200 also includes ranges from 110 to 150, 170 to 190, 153 to 162, and 145.3 to 149.6. Further, a limit of up to about 7 also includes a limit of up to about 5, up to 3, and up to about 4.5, as well as ranges within the limit, such as from about 1 to about 5, and from about 3.2 to about 6.5.

Generally speaking, methods are generally disclosed for applying a cap layer including cadmium telluride directly over a sputtered cadmium sulfide layer on a substrate. The cap layer including cadmium telluride can be deposited directly on the cadmium sulfide layer prior to exposing the cadmium sulfide layer to any the environmental atmosphere or other materials that could contaminate the cadmium sulfide layer. Thus, the cap layer can protect the cadmium sulfide layer from exposure to environmental contaminants prior to deposition of subsequent layers. As such, a substrate having a cadmium sulfide layer already deposited can be stored without significant risk of contaminating the film layers on the substrate before depositing subsequent layers (e.g., cadmium telluride layers). Additionally, the cap layer can protect the as-deposited morphology and stoichiometry of the underlying cadmium sulfide layer during the deposition process of subsequent layers, particular a cadmium telluride layer.

Not only can the cap layer protect the underlying cadmium sulfide layer from exposure to air and other airborne contaminants, but also the cap layer can protect the underlying cadmium sulfide layer from the effects of heating, evaporation, crystallization, loss of gaseous compositions (e.g., oxygen) in the cadmium sulfide layer, and defect formation in the cadmium sulfide layer during subsequent deposition processes.

Figure 3:
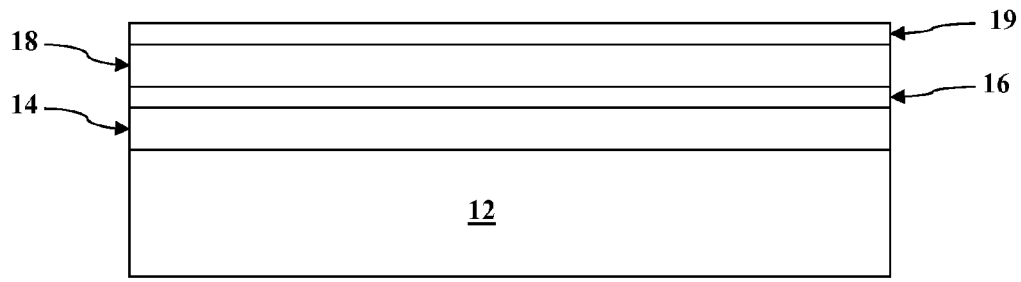
FIG. 3 shows an exemplary cap layer directly on a cadmium sulfide layer.

FIG. 3 shows, for example, a cap layer 19 directly on the cadmium sulfide layer 18 on the substrate 12. A transparent conductive oxide layer 14 and a resistive transparent buffer layer 16 are shown between the substrate 12 and the cadmium sulfide layer 18 in the exemplary embodiment shown in FIG. 3.

The cap layer can be deposited to thickness configured to inhibit the amount of sublimation off of the cadmium sulfide layer during hot deposition processes of subsequent layers. As such, the cap layer can help preserve the cadmium sulfide layer's as-deposited thickness, especially when the hot deposition process of subsequent layers is performed at deposition temperatures above the sublimation temperature of the cadmium sulfide layer. In particular, the cap layer can be a sacrificial layer that sublimes off of the cadmium sulfide layer during the hot deposition process of a subsequent layer (e.g., closed space sublimation of a cadmium telluride layer). Thus, the thickness of the cap layer can be varied according to the desired product to be manufactured. In one embodiment, a relatively thin cap layer can be deposited to allow it to be completely sacrificed during subsequent hot deposition processes and still allowing for sublimation of a portion of the underlying cadmium sulfide layer. Alternatively, the cap layer can be deposited to a thickness that will be completely sacrificed during subsequent hot deposition processes, but still leaving the underlying cadmium sulfide layer with its initial as-deposited thickness.

Figure 4:
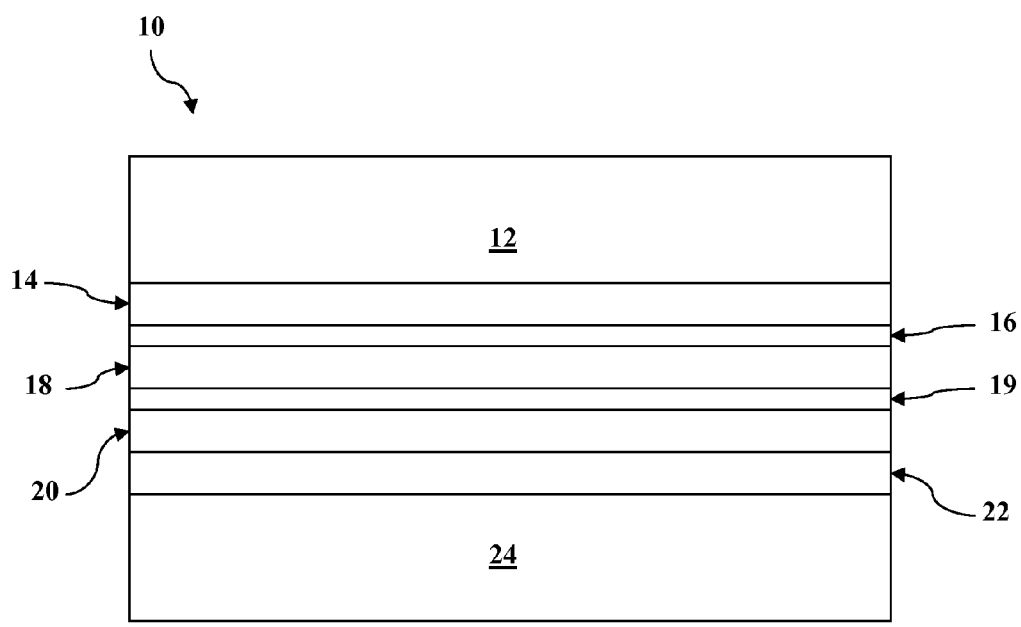
FIG. 4 shows an exemplary cadmium telluride thin film photovoltaic device with the cap layer remaining between the cadmium sulfide layer and the cadmium telluride layer; and, FIG. 5 shows a flow diagram of an exemplary method of protecting a cadmium sulfide layer.

In yet another embodiment, the cap layer can be deposited to a thickness that will leave a portion of the cap layer directly on the cadmium sulfide layer between the cadmium sulfide layer and subsequently deposited layers. For example, the cap layer can be left on the cadmium sulfide layer at a thickness of from about 1 nm to about 50 nm (e.g., from about 1 nm to about 10 nm) after deposition of a subsequent layer. FIG. 4 shows an exemplary embodiment having the cap layer 19 (or a portion of the cap layer 19) remaining in the device 10 between the cadmium sulfide layer 18 in the cadmium telluride layer 20.

In certain embodiments, the cap layer can be deposited to a thickness of about 10 nm to about 250 nm, such as from about 10 nm to about 150 nm.

In one particular embodiment, the cap layer can be sputtered from a cadmium telluride target onto a sputtered cadmium sulfide layer. For example, both the cap layer and the cadmium sulfide layer can be sputtered under a vacuum (e.g., a sputtering pressure of about 10 mTorr to about 150 mTorr), and the cap layer can be sputtered without breaking the vacuum from the sputtering of the cadmium sulfide layer (e.g., transitioning from sputtering the cadmium sulfide layer to the cap layer without increasing the pressure above about 250 mTorr). The cap layer can also be sputtered at a sputtering temperature below the sublimation temperature of the cadmium sulfide layer, to help prevent sublimation material from the cadmium sulfide layer. For instance, the cap layer can be sputtered at a sputtering temperature less than about 100° C., such as less than about 50° C. In one particular embodiment, the cap layer can be sputtered at a sputtering temperature that is about room temperature (i.e., about 20° C. to about 25° C.).

Sputtering the cap layer from a cadmium telluride target can, in one embodiment, form a cap layer having random orientation and multi-crystalline of cadmium telluride directly on the cadmium sulfide layer. In one particular embodiment, the cap layer can be sputtered to have a substantially vertical orientation of its primary axis. The cap layer, or at least a portion of the cap layer, can then be preserved directly on the cadmium sulfide layer. Without wishing to be bound by any particular theory, it is believed that closed source sublimation of cadmium telluride on a layer of cadmium telluride can produce both multiple layers of crystallites of cadmium telluride as well as crystallites with grain boundaries lying across the direction of the transport of charge carriers. Since the charge carriers undergo recombination and are reduced in the velocity of transport by such 'transverse' grain boundaries, a cap layer including cadmium telluride sputtered so as to have a substantially vertical orientation of its primary axis and remaining during the deposition of subsequent cadmium telluride layers by other physical or chemical methods can also provide for the nucleation and continuation of the grain orientation arising from the cap layer. As such, the cadmium telluride layer subsequently deposited over the cap layer can continue the initial vertical grain orientation of the cap layer. Consequently, the cadmium telluride layer arising from the cap layer can provide little or no substantial traverse or horizontal grain boundaries, leading to improved performance of the cadmium telluride-based thin film photovoltaic device.

Sputtering the cap layer can be performed under any sputtering conditions. For example, the cap layer can be sputtered from a cadmium telluride target at a sputtering pressure of about 10 mTorr to about 250 mTorr (e.g., about 10 to about 150 mTorr). As stated, the cap layer can be sputtered directly onto the cadmium sulfide layer without breaking vacuum during and between the sputtering of the cadmium sulfide layer and the sputtering of the cap layer.

Figure 5:
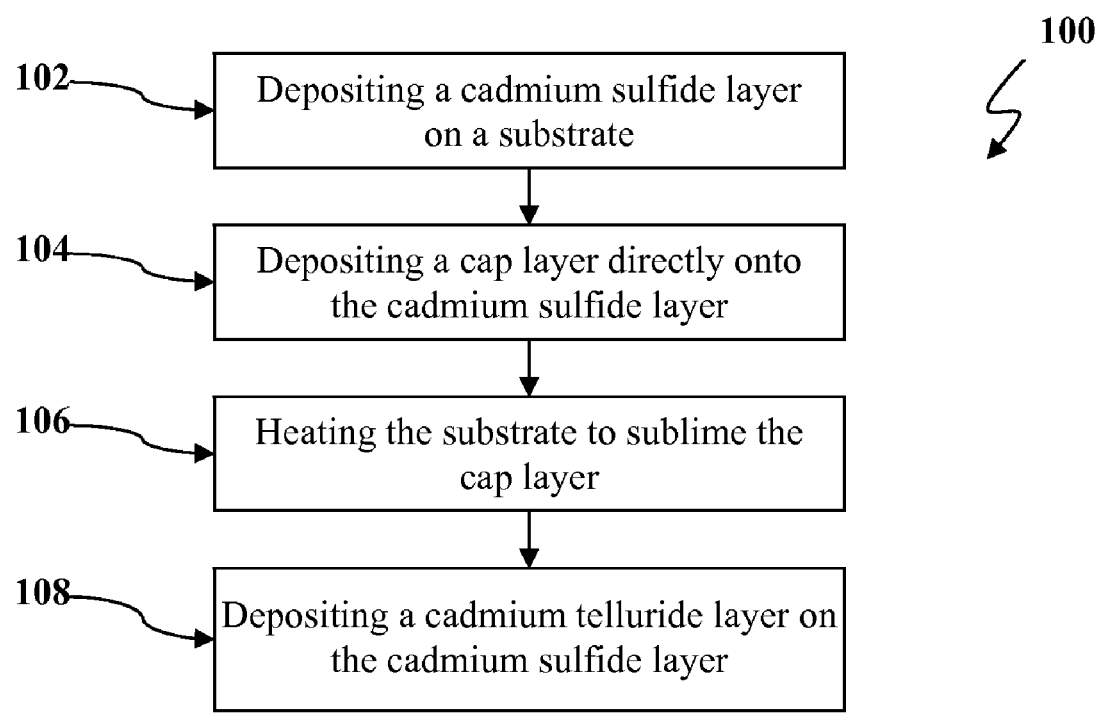

FIG. 5 shows an exemplary method 100 for protecting a cadmium sulfide layer on a substrate. At 102, a cadmium sulfide layer is deposited on a substrate. At 104, a cap layer is deposited directly onto the cadmium sulfide layer. The substrate can then be heated to sublime the cap layer at 106, and then a cadmium telluride layer can be deposited on the cadmium sulfide layer at 108.

The cap layer can be utilized in the formation of any film stack that utilizes a cadmium sulfide layer. For example, the cap layer can be used during the formation of any cadmium telluride device that utilizes a cadmium telluride layer, such as in the cadmium telluride thin film photovoltaic device disclosed in U.S. Publication No. 2009/0194165 of Murphy, et al. titled "Ultra-high Current Density Cadmium Telluride Photovoltaic Modules."

FIG. 1 and FIG. 4 represent exemplary cadmium telluride thin film photovoltaic devices 10 that can be formed according to methods described herein. The exemplary device 10 of FIG. 1 includes a top sheet of glass 12 employed as the substrate. In this embodiment, the glass 12 can be referred to as a "superstrate," as it is the substrate on which the subsequent layers are formed even though it faces upward to the radiation source (e.g., the sun) when the cadmium telluride thin film photovoltaic device 10 is in used. The top sheet of glass 12 can be a high-transmission glass (e.g., high transmission borosilicate glass), low-iron float glass, or other highly transparent glass material. The glass is generally thick enough to provide support for the subsequent film layers (e.g., from about 0.5 mm to about 10 mm thick), and is substantially flat to provide a good surface for forming the subsequent film layers. In one embodiment, the glass 12 can be a low iron float glass containing less than about 0.015% by weight iron (Fe), and may have a transmissiveness of about 0.9 or greater in the spectrum of interest (e.g., wavelengths from about 300 nm to about 900 nm). In another embodiment, borosilicate glass may be utilized so as to better withstand high temperature processing.

A transparent conductive oxide (TCO) layer 14 is shown on the glass 12 of the exemplary device 10 of FIG. 1. The TCO layer 14 allows light to pass through with minimal absorption while also allowing electric current produced by the device 10 to travel sideways to opaque metal conductors (not shown). For instance, the TCO layer 14 can have a sheet resistance less than about 30 ohm per square, such as from about 4 ohm per square to about 20 ohm per square (e.g., from about 8 ohm per square to about 15 ohm per square). The TCO layer 14 generally includes at least one conductive oxide, such as tin oxide, zinc oxide, or indium tin oxide, or mixtures thereof. Additionally, the TCO layer 14 can include other conductive, transparent materials. The TCO layer 14 can also include zinc stannate and/or cadmium stannate.

The TCO layer 14 can be formed by sputtering, chemical vapor deposition, spray pyrolysis, or any other suitable deposition method. In one particular embodiment, the TCO layer 14 can be formed by sputtering (e.g., DC sputtering or RF sputtering) on the glass 12. For example, a cadmium stannate layer can be formed by sputtering a hot-pressed target containing stoichiometric amounts of $SnO_2$ and CdO onto the glass 12 in a ratio of about 1 to about 2. The cadmium stannate can alternatively be prepared by using cadmium acetate and tin (II) chloride precursors by spray pyrolysis.

In certain embodiments, the TCO layer 14 can have a thickness between about 0.1 μm and about 1 μm, for example from about 0.1 μm to about 0.5 μm, such as from about 0.25 μm to about 0.35 μm. Suitable flat glass substrates having a TCO layer 14 formed on the superstrate surface can be purchased commercially from various glass manufactures and suppliers. For example, a particularly suitable glass 12 including a TCO layer 14 includes TEC 15 glass commercially available under the name TEC 15 TCO from Pilkington North America Inc. (Toledo, Ohio), which includes a TCO layer having a sheet resistance of 15 ohms per square.

A resistive transparent buffer layer 16 (RTB layer) is shown on the TCO layer 14 on the exemplary cadmium telluride thin film photovoltaic device 10. The RTB layer 16 is generally more resistive than the TCO layer 14 and can help protect the device 10 from chemical interactions between the TCO layer 14 and the subsequent layers during processing of the device 10. For example, in certain embodiments, the RTB layer 16 can have a sheet resistance that is greater than about 1000 ohms per square, such as from about 10 kOhms per square to about 1000 MOhms per square. The RTB layer 16 can also have a wide optical bandgap (e.g., greater than about 2.5 eV, such as from about 2.7 eV to about 3.0 eV).

Without wishing to be bound by a particular theory, it is believed that the presence of the RTB layer 16 between the TCO layer 14 and the cadmium sulfide layer 18 can allow for a relatively thin cadmium sulfide layer 18 to be included in the device 10 by reducing the possibility of interface defects (i.e., "pinholes" in the cadmium sulfide layer 18) creating shunts between the TCO layer 14 and the cadmium telluride layer 22. Thus, it is believed that the RTB layer 16 allows for improved adhesion and/or interaction between the TCO layer 14 and the cadmium telluride layer 22, thereby allowing a relatively thin cadmium sulfide layer 18 to be formed thereon without significant adverse effects that would otherwise result from such a relatively thin cadmium sulfide layer 18 formed directly on the TCO layer 14.

The RTB layer 16 can include, for instance, a combination of zinc oxide (ZnO) and tin oxide ($SnO_2$), which can be referred to as a zinc tin oxide layer ("ZTO"). In one particular embodiment, the RTB layer 16 can include more tin oxide than zinc oxide. For example, the RTB layer 16 can have a composition with a stoichiometric ratio of $ZnO/SnO_2$ between about 0.25 and about 3, such as in about a one to two (1:2) stoichiometric ratio of tin oxide to zinc oxide. The RTB layer 16 can be formed by sputtering, chemical vapor deposition, spraying pyrolysis, or any other suitable deposition method. In one particular embodiment, the RTB layer 16 can be formed by sputtering (e.g. DC sputtering or RF sputtering) on the TCO layer 14 (as discussed below in greater detail with respect to the deposition of the cadmium sulfide layer 18). For example, the RTB layer 16 can be deposited using a DC sputtering method by applying a DC current to a metallic source material (e.g., elemental zinc, elemental tin, or a mixture thereof) and sputtering the metallic source material onto the TCO layer 14 in the presence of an oxidizing atmosphere (e.g., $O_2$ gas). When the oxidizing atmosphere includes oxygen gas (i.e., $O_2$), the atmosphere can be greater than about 95% pure oxygen, such as greater than about 99%.

In certain embodiments, the RTB layer 16 can have a thickness between about 0.075 µm and about 1 µm, for example from about 0.1 µm to about 0.5 µm. In particular embodiments, the RTB layer 16 can have a thickness between about 0.08 µm and about 0.2 µm, for example from about 0.1 µm to about 0.15 µm.

A cadmium sulfide layer 18 is shown on RTB layer 16 of the exemplary device 10 of FIG. 1. The cadmium sulfide layer 18 is a n-type layer that generally includes cadmium sulfide (CdS) but may also include other materials, such as zinc sulfide, cadmium zinc sulfide, etc., and mixtures thereof as well as dopants and other impurities. In one particular embodiment, the cadmium sulfide layer may include oxygen up to about 25% by atomic percentage, for example from about 5% to about 20% by atomic percentage. The cadmium sulfide layer 18 can have a wide band gap (e.g., from about 2.25 eV to about 2.5 eV, such as about 2.4 eV) in order to allow most radiation energy (e.g., solar radiation) to pass. As such, the cadmium sulfide layer 18 is considered a transparent layer on the device 10.

The cadmium sulfide layer 18 can be formed by sputtering, chemical vapor deposition, chemical bath deposition, and other suitable deposition methods. In one particular embodiment, the cadmium sulfide layer 18 can be formed by sputtering (e.g., radio frequency (RF) sputtering) on the resistive transparent layer 16. Sputtering deposition generally involves ejecting material from a target, which is the material source, and depositing the ejected material onto the substrate to form the film. DC sputtering generally involves applying a voltage to a metal target (i.e., the cathode) positioned near the substrate (i.e., the anode) within a sputtering chamber to form a direct-current discharge. The sputtering chamber can have a reactive atmosphere (e.g., an oxygen atmosphere, nitrogen atmosphere, fluorine atmosphere) that forms a plasma field between the metal target and the substrate. The pressure of the reactive atmosphere can be between about 1 mTorr and about 20 mTorr for magnetron sputtering. When metal atoms are released from the target upon application of the voltage, the metal atoms can react with the plasma and deposit onto the surface of the substrate. For example, when the atmosphere contains oxygen, the metal atoms released from the metal target can form a metallic oxide layer on the substrate. Conversely, RF sputtering generally involves exciting a capacitive discharge by applying an alternating-current (AC) or radio-frequency (RF) signal between the target (e.g., a ceramic source material) and the substrate. The sputtering chamber can have an inert atmosphere (e.g., an argon atmosphere) having a pressure between about 1 mTorr and about 20 mTorr.

Due to the presence of the resistive transparent layer 16, the cadmium sulfide layer 18 can have a thickness that is less than about 0.1 µm, such as between about 10 nm and about 100 nm, such as from about 50 nm to about 80 nm, with a minimal presence of pinholes between the resistive transparent layer 16 and the cadmium sulfide layer 18. Additionally, a cadmium sulfide layer 18 having a thickness less than about 0.1 µm reduces any absorption of radiation energy by the cadmium sulfide layer 18, effectively increasing the amount of radiation energy reaching the underlying cadmium telluride layer 22.

A cadmium telluride layer 20 is shown on the cadmium sulfide layer 18 in the exemplary cadmium telluride thin film photovoltaic device 10 of FIG. 1 where the cap layer 19 has been completely sacrificed during the deposition of the cadmium telluride layer 20. FIG. 4, on the other hand, shows an exemplary embodiment where the cap layer 19 (or at least a portion of the cap layer 19) remains between the cadmium sulfide layer 18 and the cadmium telluride layer 20.

The cadmium telluride layer 20 is a p-type layer that generally includes cadmium telluride (CdTe) but may also include other materials. As the p-type layer of device 10, the cadmium telluride layer 20 is the photovoltaic layer that interacts with the cadmium sulfide layer 18 (i.e., the n-type layer) to produce current from the absorption of radiation energy by absorbing the majority of the radiation energy passing into the device 10 due to its high absorption coefficient and creating electron-hole pairs. For example, the cadmium telluride layer 20 can generally be formed from cadmium telluride and can have a bandgap tailored to absorb radiation energy (e.g., from about 1.4 eV to about 1.5 eV, such as about 1.45 eV) to create the maximum number of electron-hole pairs with the highest electrical potential (voltage) upon absorption of the radiation energy. Electrons may travel from the p-type side (i.e., the cadmium telluride layer 20) across the junction to the n-type side (i.e., the cadmium sulfide layer 18) and, conversely, holes may pass from the n-type side to the p-type side. Thus, the p-n junction formed between the cadmium sulfide layer 18 and the cadmium telluride layer 20 forms a diode in which the charge imbalance leads to the creation of an electric field spanning the p-n junction. Conventional current is allowed to flow in only one direction and separates the light induced electron-hole pairs.

The cadmium telluride layer 20 can be formed by any known process, such as vapor transport deposition, chemical vapor deposition (CVD), spray pyrolysis, electro-deposition, sputtering, close-space sublimation (CSS), etc. In one particular embodiment, the cadmium sulfide layer 18 is deposited by a sputtering and the cadmium telluride layer 20 is deposited by close-space sublimation. In particular embodiments, the cadmium telluride layer 20 can have a thickness between about 0.1 µm and about 10 µm, such as from about 1 µm and about 5 µm. In one particular embodiment, the cadmium telluride layer 20 can have a thickness between about 2 µm and about 4 µm, such as about 3 µm.

A series of post-forming treatments can be applied to the exposed surface of the cadmium telluride layer 20. These treatments can tailor the functionality of the cadmium telluride layer 20 and prepare its surface for subsequent adhesion to the back contact layer(s) 22. For example, the cadmium telluride layer 20 can be annealed at elevated temperatures (e.g., from about 350° C. to about 500° C., such as from about 375° C. to about 424° C.) for a sufficient time (e.g., from about 1 to about 10 minutes) to create a quality p-type layer of cadmium telluride. Without wishing to be bound by theory, it is believed that annealing the cadmium telluride layer 20 (and the device 10) converts the normally lightly p-type doped, or even n-type doped, cadmium telluride layer 20 to a more strongly p-type cadmium telluride layer 20 having a relatively low resistivity. Additionally, the cadmium telluride layer 20 can recrystallize and undergo grain growth during annealing.

Annealing the cadmium telluride layer 20 can be carried out in the presence of cadmium chloride in order to dope the cadmium telluride layer 20 with chloride ions. For example, the cadmium telluride layer 20 can be washed with an aqueous solution containing cadmium chloride and then annealed at the elevated temperature.

In one particular embodiment, after annealing the cadmium telluride layer 20 in the presence of cadmium chloride, the surface can be washed to remove any cadmium oxide formed on the surface. This surface preparation can leave a Te-rich surface on the cadmium telluride layer 20 by removing oxides from the surface, such as CdO, $CdTeO_3$, $CdTe_2O_5$, etc. For instance, the surface can be washed with a suitable solvent (e.g., ethylenediamine also known as 1,2 diaminoethane or "DAE") to remove any cadmium oxide from the surface.

Additionally, copper can be added to the cadmium telluride layer 20. Along with a suitable etch, the addition of copper to the cadmium telluride layer 20 can form a surface of copper-telluride on the cadmium telluride layer 20 in order to obtain a low-resistance electrical contact between the cadmium telluride layer 20 (i.e., the p-type layer) and the back contact layer(s). Specifically, the addition of copper can create a surface layer of cuprous telluride ($Cu_2Te$) between the cadmium telluride layer 20 and the back contact layer 22. Thus, the Te-rich surface of the cadmium telluride layer 20 can enhance the collection of current created by the device through lower resistivity between the cadmium telluride layer 20 and the back contact layer 22.

Copper can be applied to the exposed surface of the cadmium telluride layer 20 by any process. For example, copper can be sprayed or washed on the surface of the cadmium telluride layer 20 in a solution with a suitable solvent (e.g., methanol, water, or the like, or combinations thereof) followed by annealing. In particular embodiments, the copper may be supplied in the solution in the form of copper chloride, copper iodide, or copper acetate. The annealing temperature is sufficient to allow diffusion of the copper ions into the cadmium telluride layer 20, such as from about 125° C. to about 300° C. (e.g. from about 150° C. to about 200° C.) for about 5 minutes to about 30 minutes, such as from about 10 to about 25 minutes.

A back contact layer 22 is shown on the cadmium telluride layer 20. The back contact layer 22 generally serves as the back electrical contact, in relation to the opposite, TCO layer 14 serving as the front electrical contact. The back contact layer 22 can be formed on, and in one embodiment is in direct contact with, the cadmium telluride layer 20. The back contact layer 22 is suitably made from one or more highly conductive materials, such as elemental nickel, chromium, copper, tin, aluminum, gold, silver, technetium or alloys or mixtures thereof. Additionally, the back contact layer 22 can be a single layer or can be a plurality of layers. In one particular embodiment, the back contact layer 22 can include graphite, such as a layer of carbon deposited on the p-layer followed by one or more layers of metal, such as the metals described above. The back contact layer 22, if made of or comprising one or more metals, is suitably applied by a technique such as sputtering or metal evaporation. If it is made from a graphite and polymer blend, or from a carbon paste, the blend or paste is applied to the semiconductor device by any suitable method for spreading the blend or paste, such as screen printing, spraying or by a "doctor" blade. After the application of the graphite blend or carbon paste, the device can be heated to convert the blend or paste into the conductive back contact layer. A carbon layer, if used, can be from about 0.1 µm to about 10 µm in thickness, for example from about 1 µm to about 5 µm. A metal layer of the back contact, if used for or as part of the back contact layer 22, can be from about 0.1 µm to about 1.5 µm in thickness.

The encapsulating glass 24 is also shown in the exemplary cadmium telluride thin film photovoltaic device 10 of FIG. 1.

Other components (not shown) can be included in the exemplary device 10, such as bus bars, external wiring, laser etches, etc. For example, when the device 10 forms a photovoltaic cell of a photovoltaic module, a plurality of photovoltaic cells can be connected in series in order to achieve a desired voltage, such as through an electrical wiring connection. Each end of the series connected cells can be attached to a suitable conductor such as a wire or bus bar, to direct the photovoltaically generated current to convenient locations for connection to a device or other system using the generated electric. A convenient means for achieving such series connections is to laser scribe the device to divide the device into a series of cells connected by interconnects. In one particular embodiment, for instance, a laser can be used to scribe the deposited layers of the semiconductor device to divide the device into a plurality of series connected cells.

Figure 2:
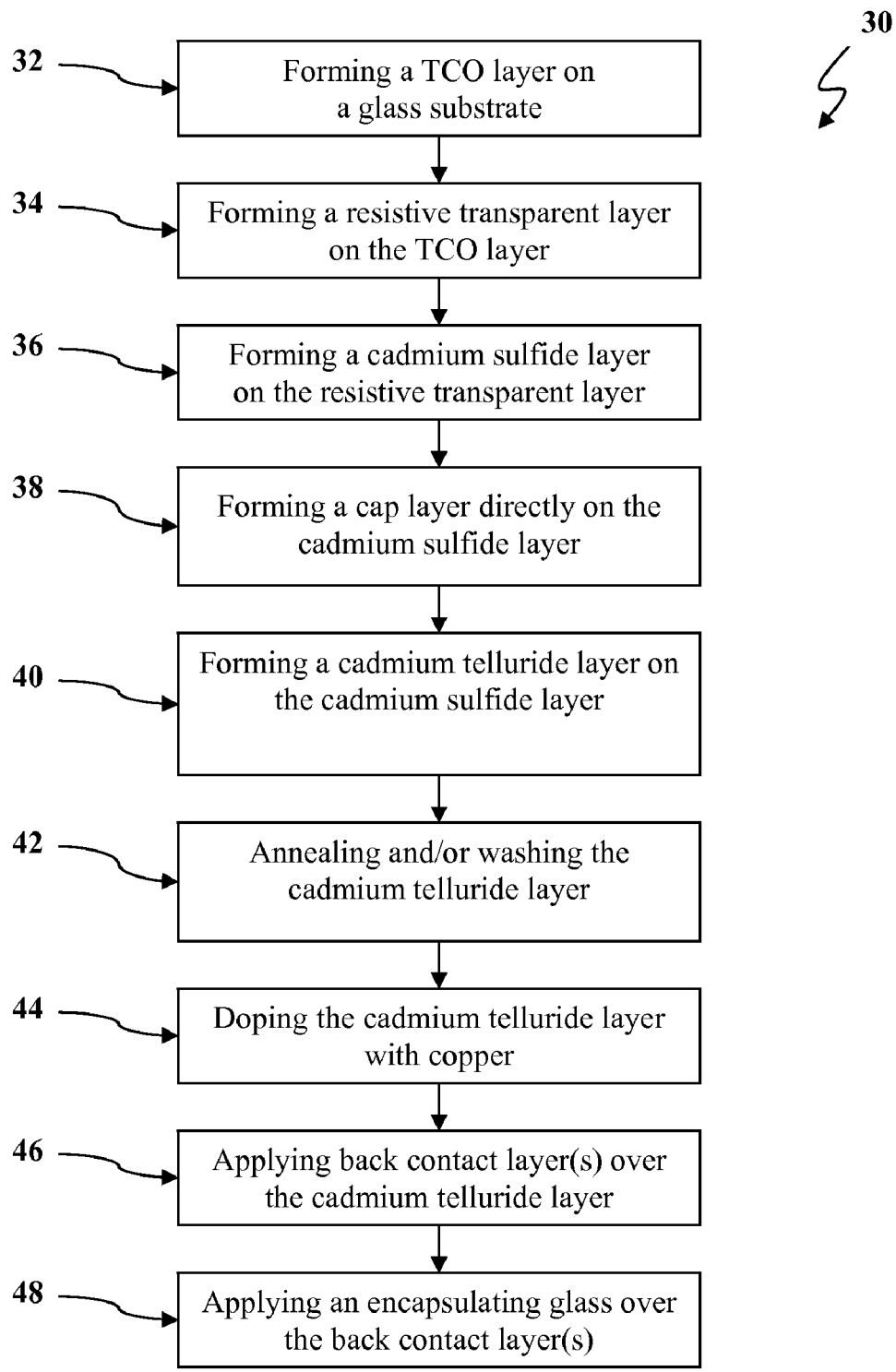
FIG. 2 shows a flow diagram of an exemplary method of manufacturing a photovoltaic module including a cadmium telluride thin film photovoltaic device.

FIG. 2 shows a flow diagram of an exemplary method 30 of manufacturing a photovoltaic device according to one embodiment of the present invention. According to the exemplary method 30, a TCO layer is formed on a glass substrate at 32. At 34, a resistive transparent layer is formed on the TCO layer. A cadmium sulfide layer is formed on the resistive transparent layer at 36, and a cap layer is formed directly on the cadmium sulfide layer at 38. At 40, a cadmium telluride layer can be formed on the cadmium sulfide layer (with the cap layer either completely sublimating off or only partially sublimating off of the cadmium sulfide layer). At 42, the cadmium telluride layer can be annealed (e.g., in the presence of cadmium chloride) and washed (e.g., to remove oxides formed on the surface). The cadmium telluride layer can be doped with copper at 44. At 46, back contact layer(s) can be applied over the cadmium telluride layer, and an encapsulating glass can be applied over the back contact layer at 48.

One of ordinary skill in the art should recognize that other processing and/or treatments can be included in the method 30. For instance, the method may also include laser scribing to form electrically isolated photovoltaic cells in the device. These electrically isolated photovoltaic cells can then be connected in series to form a photovoltaic module. Also, electrical wires can be connected to positive and negative terminals of the photovoltaic module to provide lead wires to harness electrical current produced by the photovoltaic module.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A method of protecting a cadmium sulfide layer for further processing, the method comprising:
    sputtering a cadmium sulfide layer onto a substrate from a cadmium sulfide target at a sputtering pressure;
    sputtering a cap layer directly on the cadmium sulfide layer without breaking vacuum of the sputtering pressure, wherein the cap layer comprises cadmium telluride;
    heating the substrate to sublimate at least a portion of the cap layer from the cadmium sulfide layer; and,
    thereafter, depositing a cadmium telluride layer on the cadmium sulfide layer.

2. The method as in claim 1, wherein the cap layer is sputtered directly onto the cadmium sulfide layer from a cadmium telluride target.

3. The method as in claim 1, wherein the sputtering pressure is about 1 mTorr to about 20 mTorr.

4. The method as in claim 1, wherein the cadmium sulfide layer and the cap layer are sputtered in a sputtering atmosphere comprising an inert gas.

5. The method as in claim 4, wherein the sputtering atmosphere further comprises oxygen from greater than 0% to about 20% by volume.

6. The method as in claim 1, wherein the cap layer is sputtered at a sputtering temperature below the sublimation temperature of the cadmium sulfide layer.

7. The method as in claim 1, wherein the cap layer is sputtered to a thickness of about 10 nm to about 150 nm.

8. A method of protecting a cadmium sulfide layer for further processing, the method comprising:
sputtering a cadmium sulfide layer onto a substrate from a cadmium sulfide target at a puttering pressure;
sputtering a cap lam directly on the cadmium sulfide layer without breaking vacuum of the sputtering pressure, wherein the cap layer comprises cadmium telluride, wherein the cap layer is sputtered from a cadmium telluride target to have a substantially vertical orientation of its primary axis;
heating the substrate to sublimate at least a portion of the cap layer from the cadmium sulfide layer; and,
thereafter, depositing a cadmium telluride layer on the cadmium sulfide layer.

9. The method as in claim 1, wherein the cap layer is completely sublimed to expose the cadmium sulfide layer such that the cadmium telluride layer is deposited directly on the cadmium sulfide layer.

10. The method as in claim 1, wherein the cap layer is sublimed to leave a portion of the cap layer between the cadmium sulfide layer and the cadmium telluride layer.

11. The method as in claim 1, wherein the substrate is heated to a deposition temperature of about 250° C. to about 650° C. to sublimate at least a portion of the cap layer.

12. The method as in claim 1, wherein both the cadmium sulfide layer and the cap layer are deposited via sputtering at a sputtering temperature of less than about 50° C.

13. The method as in claim 1, wherein the cadmium telluride layer is deposited on the cadmium sulfide layer via closed space sublimation.

14. The method as in claim 8, wherein the sputtering pressure is about 1 mTorr to about 20 mTorr.

15. The method as in claim 8, wherein the cadmium sulfide layer and the cap layer are sputtered in a sputtering atmosphere comprising an inert gas.

16. The method as in claim 15, wherein the sputtering atmosphere further comprises oxygen from greater than 0% to about 20% by volume.

17. The method as in claim 8, wherein the cap layer is sputtered at a sputtering temperature below the sublimation temperature of the cadmium sulfide layer.

18. The method as in claim 8, wherein the cap layer is sputtered to a thickness of about 10 nm to about 150 nm.

19. The method as in claim 8, wherein the cadmium telluride layer is deposited on the cadmium sulfide layer via closed space sublimation.

* * * * *